United States Patent
Hwang

(10) Patent No.: US 9,520,531 B2
(45) Date of Patent: Dec. 13, 2016

(54) SYSTEMS AND METHODS FOR DEPOSITING AND CHARGING SOLAR CELL LAYERS

(71) Applicant: Amtech Systems, Inc., Tempe, AZ (US)

(72) Inventor: Jeong-Mo Hwang, Tempe, AZ (US)

(73) Assignee: Amtech Systems, Inc., Tempe, AZ (US)

( * ) Notice: Subject to any disclaimer, the term of this patent is extended or adjusted under 35 U.S.C. 154(b) by 806 days.

(21) Appl. No.: 13/954,099

(22) Filed: Jul. 30, 2013

(65) Prior Publication Data

US 2014/0057386 A1    Feb. 27, 2014

Related U.S. Application Data

(60) Continuation-in-part of application No. 13/676,923, filed on Nov. 14, 2012, now abandoned, which is a
(Continued)

(51) Int. Cl.
*H01L 31/18* (2006.01)
*H01J 37/32* (2006.01)
(Continued)

(52) U.S. Cl.
CPC ..... *H01L 31/1868* (2013.01); *H01J 37/32082* (2013.01); *H01J 37/32146* (2013.01);
(Continued)

(58) Field of Classification Search
CPC .......... H01L 31/1868; H01L 31/02167; H01L 31/02168; H01L 31/068; H01J 37/32082; H01J 37/32146; H01J 37/32706; Y02P 70/521; Y02E 10/547

See application file for complete search history.

(56) References Cited

U.S. PATENT DOCUMENTS

| | | | |
|---|---|---|---|
| 4,253,881 A | 3/1981 | Hezel | |
| 6,054,357 A * | 4/2000 | Choi | ................. H01L 21/82381 257/405 |

(Continued)

FOREIGN PATENT DOCUMENTS

| | | |
|---|---|---|
| EP | 0648069 | 10/1999 |
| JP | 2005183469 | 7/2005 |

OTHER PUBLICATIONS

J. Schmidt, A. Merkle, R. Brendel, B. Hoex, M. C. M. Van De Sanden, and W. M. M. Kessels; Surface Passivation of High-efficiency Silicon Solar Cells by Atomic-layer-deposited Al2O3; Progress in Photovoltaics: Research and Applications; Mar. 3, 2008; vol. 16; p. 461-466; John Wiley & Sons, Ltd.
(Continued)

*Primary Examiner* — Yasser A Abdelaziez
(74) *Attorney, Agent, or Firm* — Adam R. Stephenson, Ltd.

(57) ABSTRACT

Systems and methods of the present invention may be used to charge a layer (such as a passivation layer and/or antireflective layer) of a solar cell (e.g., wafer) with a positive or negative charge. The layer may retain the charge to improve operation of the solar cell. The charged layer may include any suitable dielectric material capable of retaining either a negative or a positive charge. Systems and methods of the present invention permit in-situ charging of a layer. Charging of a layer may be accomplished during or after deposition of the layer including after completing the whole solar cell process, in other words, on a finished cell.

21 Claims, 6 Drawing Sheets

Related U.S. Application Data division of application No. 13/050,915, filed on Mar. 17, 2011, now Pat. No. 8,338,211, which is a continuation-in-part of application No. 12/844,746, filed on Jul. 27, 2010, now abandoned.

(51) Int. Cl.
  *H01L 31/0216* (2014.01)
  *H01L 31/068* (2012.01)

(52) U.S. Cl.
  CPC .. *H01J 37/32706* (2013.01); *H01L 31/02167* (2013.01); *H01L 31/02168* (2013.01); *H01L 31/068* (2013.01); *Y02E 10/547* (2013.01); *Y02P 70/521* (2015.11)

(56) References Cited

U.S. PATENT DOCUMENTS

| | | | | |
|---|---|---|---|---|
| 6,165,376 | A | * | 12/2000 | Miyake ............ C23C 16/515 216/67 |
| 2007/0029194 | A1 | | 2/2007 | Matsumoto |
| 2008/0150002 | A1 | | 6/2008 | Hwang |
| 2009/0168517 | A1 | | 7/2009 | Scade |
| 2009/0283139 | A1 | | 11/2009 | Chen |
| 2010/0203742 | A1 | | 8/2010 | Borden |
| 2010/0230771 | A1 | | 9/2010 | Fork |
| 2010/0258168 | A1 | | 10/2010 | Yu |
| 2010/0311203 | A1 | | 12/2010 | Borden |
| 2011/0136286 | A1 | | 6/2011 | Stewart |
| 2011/0303278 | A1 | | 12/2011 | Fu |
| 2012/0048376 | A1 | | 3/2012 | Gilman |

OTHER PUBLICATIONS

Jan Benick, Bram Hoex, M.C.M. Van De Sanden, W.M.M. Kessels, Oliver Schultz, and Stefan W. Glunz; High Efficiency N-type Si Solar Cells on Al2O3-passivated Boron Emitters; Applied Physics letters, Jun. 25, 2008; vol. 92; p. 253504-1; Applied Physics Letters.

Jan Schmidt, Agnes Merkle, Robert Bock, Pietro P. Altermatt, Andres Cuevas, Nils-Peter Harder, Bram Hoex, Richard Van De Sanden, Erwin Kessels, Rolf Brendel; Progress in the Surface Passivation of Silicon Solar Cells; 23rd European Photovoltaic Solar Energy Conference, Valencia, Spain, Sep. 2008.

H. Jin, K.J. Weber, B.B. Paudyal, and C. Zhang; Introduction of Negative Charges in Nitride for PV Applications; Center for Sustainable Energy Systems, Faculty of Engineering and Information Science, The Australian National University, Canberra, ACT, Australia; p. 17-21; IEEE; 2009.

H.E. Elgamel, Allen M. Barnett, A. Rohatgi, Z. Chen, C. Vinckier, J. Nijs, and R. Mertens; Efficient combination of surface and bulk passivation scheme of high-efficiency multicrystalline silicon solar cells; Journal of Applied Physics, vol. 78(5), Sep. 1, 1995; p. 3457-3461.

K.J. Weber and H. Jin; Improved Silicon Surface Passivation Achieved by Negatively Charged Silicon Nitride Films, Applied Physics Letters, vol. 94, p. 063509-1, Feb. 11, 2009.

\* cited by examiner

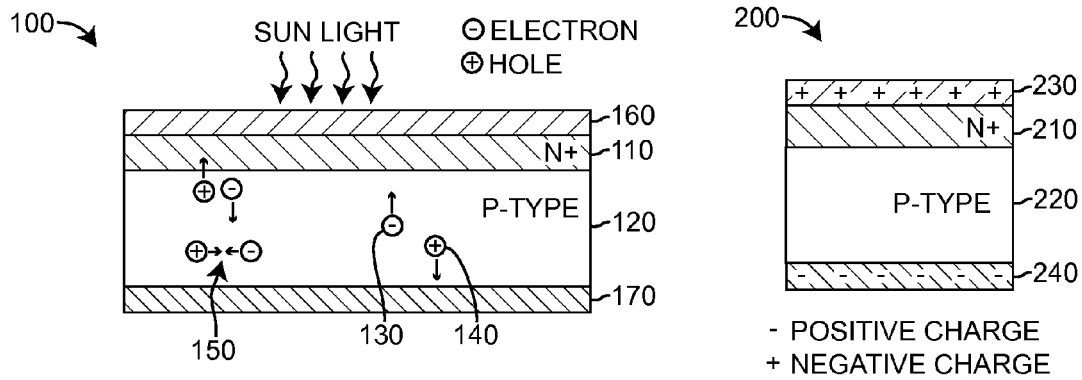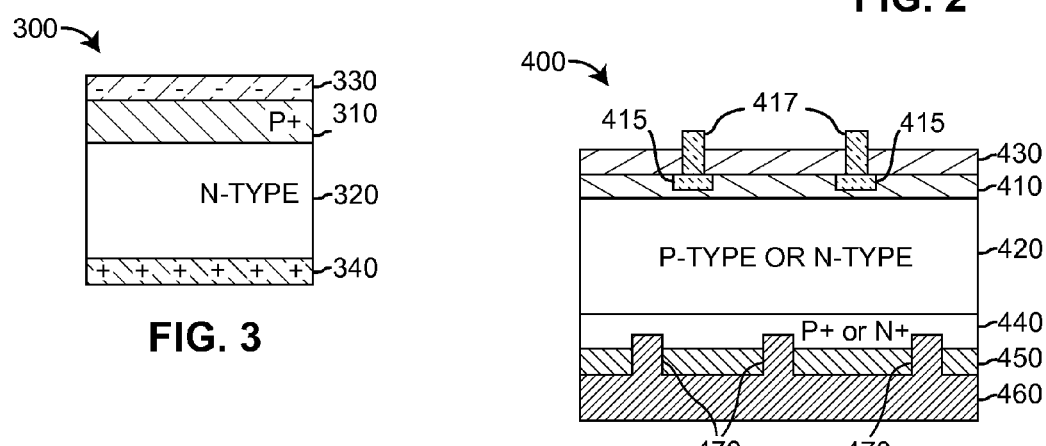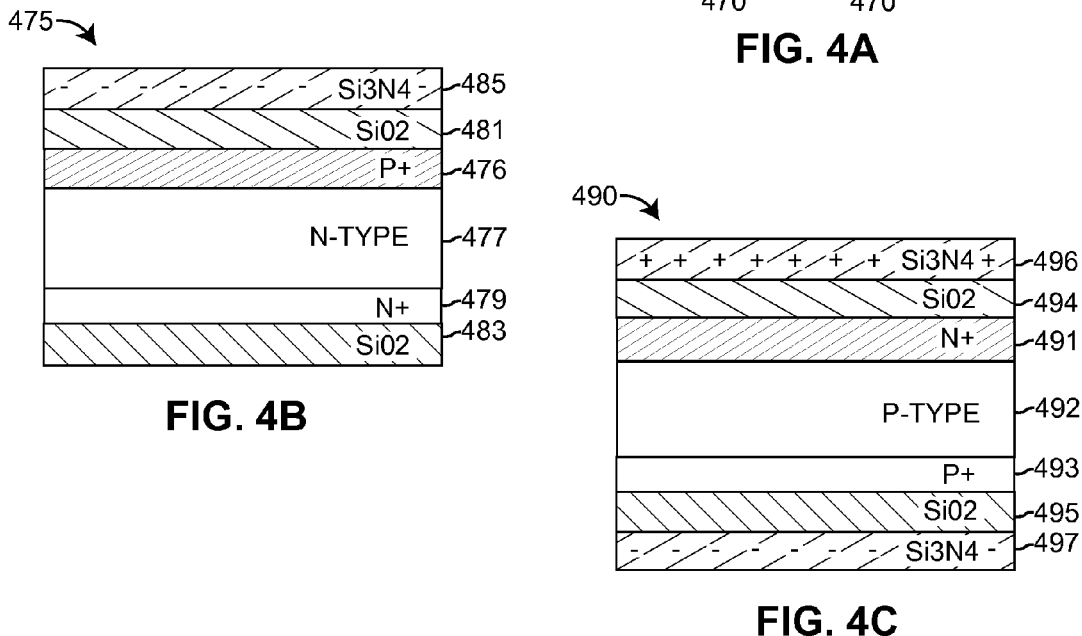

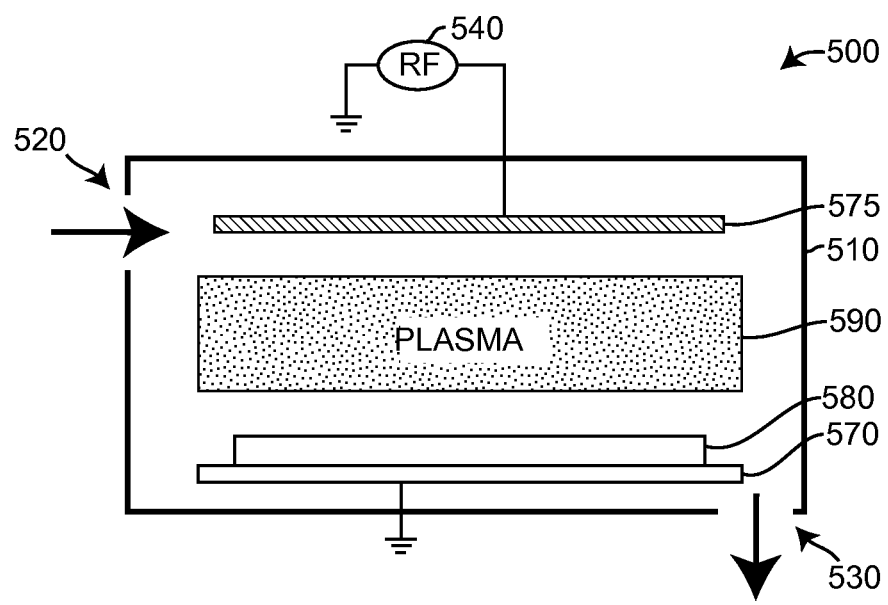
(PRIOR ART) FIG. 5
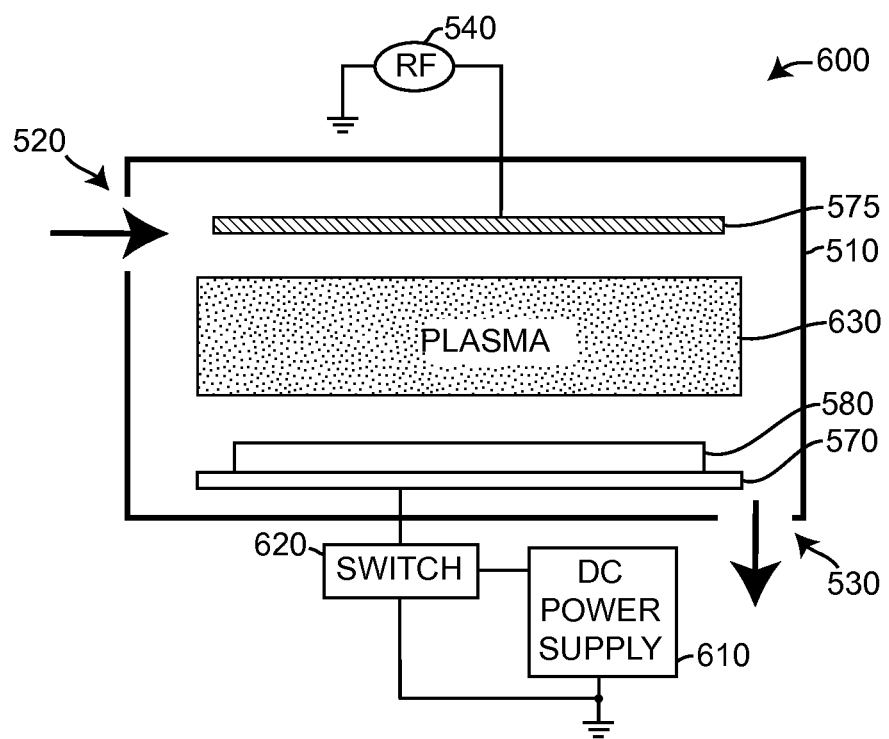
FIG. 6

SYSTEMS AND METHODS FOR DEPOSITING AND CHARGING SOLAR CELL LAYERS

CROSS-REFERENCE TO RELATED APPLICATIONS

This application is a continuation-in-part, and claims the benefit under 35 U.S.C. §120, of U.S. patent application Ser. No. 13/676,923 entitled "Systems for Charging Solar Cell Layers", filed Nov. 14, 2012, now pending, which is a divisional, and claims the benefit under 35 U.S.C. §121, of U.S. patent application Ser. No. 13/050,915 entitled "Systems and Methods for Charging Solar Cell Layers", filed Mar. 17, 2011, now U.S. Pat. No. 8,338,211, which is a continuation-in-part, and claims the benefit under 35 U.S.C. §120, of U.S. patent application Ser. No. 12/844,746, entitled "Charge Control of Solar Cell Passivation Layers", filed Jul. 27, 2010, now abandoned, the disclosure of each of the above applications is incorporated herein by reference.

FIELD OF THE INVENTION

The present invention relates systems and methods for depositing and/or charging layers of semiconductors, particularly in solar cell applications.

BACKGROUND OF THE INVENTION

Solar cells (e.g., photovoltaic cells) convert light energy into electricity. The semiconductor cross-section of FIG. 1 illustrates a conventional solar cell 100 that includes N-type semiconductor layer 110 (e.g., emitter) in contact with a thick P-type semiconductor layer 120 (e.g., substrate, base). The interface between a P-type semiconductor material and an N-type semiconductor material is known as a P-N junction. A solar cell that includes a P-type substrate, as shown in FIG. 1, is referred to as a P-type solar cell or P-type cell. In P-type semiconductor material, the hole (e.g., the absence of valence electrons) is the majority carrier and the free electron is the minority carrier. In N-type semiconductor material, the electron is the majority carrier and the hole is the minority carrier.

As a photon with an energy higher than the semiconductor band-gap (e.g., 1.1 eV for silicon) enters the cell 100, it is absorbed by generating free electron 130 and hole 140 pair in the cell 100. Sunlight contains photons with a wide range of energies from infra-red to ultraviolet. Higher energy photons (e.g. shorter wave-length light) are absorbed near the semiconductor surface while lower energy photons (e.g., long wavelength light) penetrate to deeper regions of the substrate. Photo-generated minority-carrier electrons 130 in the P-type semiconductor layer 120 move toward the P-N junction by diffusion and collect to the N-type emitter, which causes an electrical current to flow in solar cell 100. A portion of the electrons 130 and holes 140 generated by a photon in substrate 120 tend to recombine (e.g., see 150) with each other, particularly at defect sites in the silicon. Recombination of electrons and holes in the substrate is referred to as "bulk recombination". Electrons and holes that recombine do not contribute to electrical current generation, thereby decreasing the efficiency of solar cell 100.

Photo-generated minority carriers, holes in N-type semiconductor material or electrons in P-type semiconductor material, tend to recombine at surface defects formed by the abrupt termination of the semiconductor material at the front and back surfaces of the semiconductor. This phenomenon is often referred to as "surface recombination" and may be measured in surface recombination velocity.

In thinner semiconductor wafers, which many manufacturers seek to produce in order to reduce the cost of manufacturing solar cells, surface recombination, in particular at the back surface, is more significant, while bulk recombination is less significant. The thinner the semiconductor, the greater the number of photo-generated carriers located near the back surface. While the loss of photo-generated minority carriers due to bulk recombination decreases as the semiconductor thickness becomes comparable to or smaller than the minority-carrier diffusion length, the increased number of photo-generated carriers located near the back surface tend to recombine at the back surface thereby decreasing the total efficiency of the solar cell.

Referring again to FIG. 1, adding a dielectric layer 160 to the front surface of solar cell 100 functions as an antireflective coating (e.g., layer) and a surface passivation layer that helps reduce electron/hole surface recombination. A passivation layer reduces the number of surface defects like silicon dangling bonds at the surface of the semiconductor thereby reducing surface recombination.

Coating 160 (e.g., antireflective/passivation) often includes silicon nitride ($Si_3N_4$ in stoichiometric or $SiN_x$ in non-stoichiometric), which is typically applied using a process known as plasma-enhanced chemical vapor deposition ("PECVD"). Silicon nitride deposited using PECVD is non-stoichiometric denoted as $SiN_x$ and normally includes a large density of positive charges. The positive charges in the PECVD deposited silicon nitride make silicon nitride a suitable coating for N-type semiconductor material (e.g., emitter 110) of a solar cell. However, PECVD deposited silicon nitride is a less suitable coating for P-type semiconductor material (e.g., base 120) of a solar cell because the positive charge density of PECVD silicon nitride tends to interact with the P-type semiconductor material to cause a detrimental effect known as "parasitic shunting." See *Surface Passivation of High-efficiency Silicon Solar Cells by Atomic-layer-deposited Al2O3*, J. Schmidt et al., Prog. Photovolt: Res. Appl. 2008; 16:461-466 at 462. A layer of Al2O3, which is known to normally have a high density of negative charge, is a more suitable coating (e.g., passivation layer 170) for the back (e.g., rear) surface passivation of P-type base 120. Id. Therefore, a different passivation layer other than silicon nitride is used for a P-type base 120. However, such a new passivation material requires an additional capping layer like a silicon nitride film for thermal stability during subsequent high-temperature process like a metal contact firing. The two-layer stack structure can be more costly than a single layer structure. The present invention addresses these and other issues.

SUMMARY OF THE INVENTION

Systems and methods of the present invention can be used to charge a charge-holding layer (e.g., dielectric layer, passivation layer, antireflective layer) of a solar cell with a positive or negative charge as desired. A charge-holding layer of a solar cell may include any suitable dielectric material, preferably silicon nitride (e.g., SiNx), capable of holding either a negative or a positive charge. A charge-holding layer may be charged at any suitable point during manufacture of the cell including during deposition of the layer, after deposition of the layer, after a high-temperature process step, and/or after completing the entire manufacturing process flow, in other words, charging may be performed on a finished cell.

A method for charging a layer, according to one aspect of the invention, includes positioning a solar cell in electrical communication with an electrode (e.g., charging plate) inside a chamber. The solar cell includes an emitter, a base, a first passivation layer adjacent the emitter, and a second passivation layer adjacent the base. Gas is injected into the chamber and a plasma is generated using the gas. The first passivation layer and/or the second passivation layer may be charged to a predetermined polarity (e.g., positive, negative). Charging may be accomplished by applying a voltage pulse (e.g., direct current ("DC")) to the solar cell via the electrode for a predetermined period of time. The first and the second passivation layers may be a single dielectric layer such as a nitride (e.g., silicon nitride), a two-layer stack such as nitride/oxide (e.g., silicon dioxide) adjacent to the silicon substrate, or a triple-layer stack such as top oxide/nitride/bottom oxide adjacent to the silicon substrate, respectively.

The solar cell may be any type of solar cell structure such as a typical silicon based front junction cell with or without heavily-doped back surface field (BSF), a back junction cell with or without heavily-doped front surface field (FSF), or a back junction & back contact cell with no metal contact on the front side.

A system according to various aspects of the present invention may include a chamber having a gas inlet configured to inject a gas into a chamber. The system further includes a plasma-generating electrode as well as a radio-frequency ("RF") power supply electrically coupled to the plasma-generating electrode. The RF power supply is configured to apply an alternating current ("AC") signal to the plasma-generating electrode to generate a plasma by ionizing the gas. Photons from (e.g., generated by) the plasma may have a magnitude of energy (e.g., energy level) of at least about 3 eV. The system includes a charging electrode (e.g., plate). The charging electrode receives a solar cell such that the solar cell and charging electrode are in electrical communication. The solar cell includes an emitter, a base, a first passivation layer adjacent the emitter, and a second passivation layer adjacent the base. The system further includes a direct current ("DC") power supply electrically coupled to the charging electrode. When the DC power supply applies a pulse to the charging electrode for a predetermined period of time, the first passivation layer and/or the second passivation layer is charged to a predetermined polarity.

The gas can be any suitable gas but preferably an inert gas such as nitrogen, argon or helium. The system may include an RF choke circuit, which electrically separates (e.g., isolates, blocks) the RF power supply from the DC power supply.

The system may also include two plates (e.g., electrodes) for generating a plasma that are separate from the charging electrode so that the RF power supply is electrically separate from the DC power supply thereby making the plasma operation more stable.

The system, according to various aspects of the present invention, may be a stand-alone system or it may be integrated into a PECVD film deposition system using the same chamber for both functions of deposition and charging. The system may also use two separate chambers for each function so that the film deposition and the charging may be done sequentially.

BRIEF DESCRIPTION OF THE DRAWING

Embodiments of the present invention will now be further described with reference to the drawing, wherein like designations denote like elements, and:

FIG. 1 is a schematic view of a vertical cross-section of a conventional solar cell;

FIGS. 2, 3, 4A, 4B, and 4C are schematic views of vertical cross-sections of solar cells according to various aspects of the present invention;

FIG. 5 depicts a configuration of a conventional PECVD SiNx deposition system;

FIGS. 6 and 7 depict systems for charging a passivation layer of a solar cell according to various aspects of the present invention;

DETAILED DESCRIPTION OF THE PREFERRED EMBODIMENTS

Figure 7:
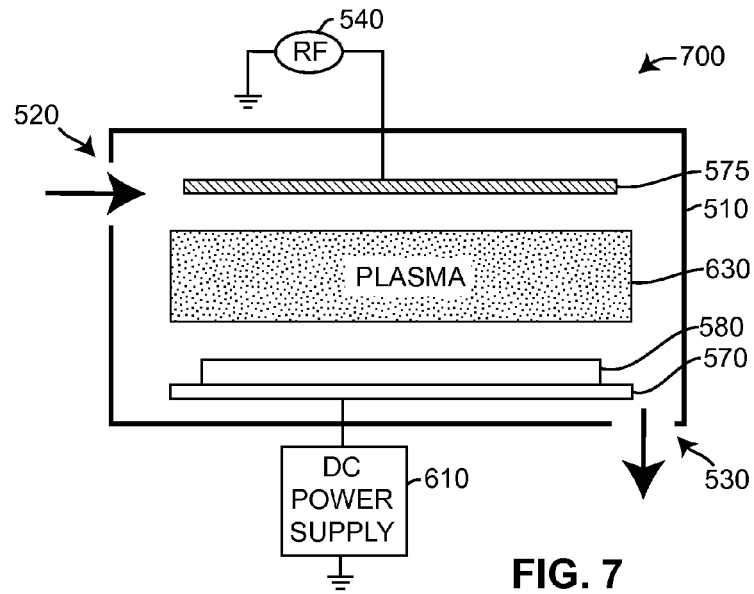

Turning now to the drawing, where the purpose is to describe preferred embodiments of the invention and not to limit same, a solar cell according to one embodiment of the present invention is shown in FIG. 2. Solar cell 200, according to various aspects of the present invention, is a P-type cell which includes emitter 210 (e.g., N+ emitter) formed of a heavily doped (e.g., N+) N-type semiconductor material and base 220 formed of a lightly doped (e.g., P−) P-type semiconductor material that also functions (e.g., operates) as the substrate. Cell 200 further includes passivation layer 230 adjacent to emitter 210 and passivation layer 240 adjacent to base 220.

Passivation may include "field-effect passivation" which is distinguished from so called "chemical passivation". Chemical passivation reduces surface recombination by passivating dangling bonds at the surface with chemical bonding such as thermal oxide passivation or surface passivation by hydrogen atom. The "+" and "−" signs of FIG. 2 indicate the desired charge of passivation layers 230 and 240. Passivation layers 230 and 240 chemically passivate their respective silicon surfaces to reduce surface recombination and to increase solar cell efficiency. The respective charge in the passivation layers provides field-effect passivation that further reduces surface recombination thereby further increasing solar cell efficiency.

Passivation layer 230 (e.g., front passivation) includes a positive charge that accomplishes field-effect passivation. The positive charges of layer 230 attract electrons (e.g., majority carriers) toward the surface of layer 210 but repel holes (e.g., minority carriers) from the front surface, thereby reducing surface recombination at the front surface. Passivation layer 240 (e.g., back passivation) includes a negative charge that attracts holes (e.g., majority carriers) toward the back surface of layers 220, but repels electrons (e.g., minority carriers) from the back surface, thereby decreasing surface recombination at the back surface.

In another embodiment, referring to FIG. 3, according to various aspects of the present invention, N-type solar cell 300 includes emitter 310 formed of a heavily doped (e.g., P+) P-type semiconductor material and base 320 formed of a lightly doped (e.g., N−) N-type semiconductor material that also functions as the substrate (e.g., base). Cell 300 further includes passivation layer 330 adjacent to emitter 310 and passivation layer 340 adjacent to the base 320. Passivation layer 330 (e.g., front passivation) includes a negative charge to further reduce surface recombination as discussed above. Passivation layer 340 (e.g., back passivation) includes a positive charge to further reduce surface recombination at the back surface as discussed above.

The term a "passivation layer" may refer to a layer deposited to perform the function of chemical passivation or a layer deposited to perform the function of chemical passivation and to operate as an antireflective simultaneously. Generally, the layer deposited on the front side of a solar cell that will be exposed to light during normal operation functions as an antireflective coating as well as a passivation layer whereas the layer deposited on the back side of a solar cell is for passivation purposes mostly except for bi-facial cell in which light comes into cell from both (e.g., front and back) sides.

N+ emitter 210 and N-type base 320 of solar cells 200 and 300 respectively each include a semiconductor material doped with a conventional N-type dopant such as phosphorous and/or arsenic for silicon semiconductor materials. P-type base 220 and P+ emitter 310 each include a semiconductor material doped with a conventional P-type dopant such as boron, gallium, and/or indium for silicon semiconductor materials. Solar cells 200 and 300 may be formed of conventional semiconductor materials other than silicon including germanium, gallium arsenide, and/or silicon carbide. Solar cells 200 and 300 may further include a thin silicon dioxide (e.g., SiO2) layer (e.g., interfacial layer) between the charged passivation layer and the semiconductor surface. An interfacial layer may reduce surface recombination by further improvement in chemical passivation. An interfacial layer may be used with front and/or back surface passivation. An interfacial layer may have another advantage that it prevents charge movement from the charged passivation layer into the semiconductor material (e.g., silicon), because the silicon dioxide (e.g., SiO2) layer provides an energy barrier to electrons or holes stored in the charged layer.

The thickness (e.g., height) of emitters 210, 310 and bases 220, 320 in FIGS. 2 and 3 are not to scale. The thickness of any semiconductor layer, passivation, and/or coating may be of any thickness needed to perform the functions of the material. Emitters 210 and 310 and bases 220 and 320 may be any suitable size, shape, or configuration, and need not be of uniform thickness.

In another embodiment, solar cell 400, according to various aspects of the present invention, exhibits a more complete cross-section including metal fingers on front side and metal contacts on back side. It includes lightly doped emitter 410 adjacent to substrate 420. Heavily-doped emitters 415 are formed (e.g., via diffusion, implantation) in lightly doped emitter layer 410. Emitters 415 are formed of the same type (e.g., N-type, P-type) of semiconductor material as lightly doped layer 410. Emitters 415 are in further contact with metal (e.g., silver) grids 417. Back-surface field ("BSF") layer 440 is adjacent and coupled to substrate 420. BSF layer may be formed by heavily doping the back surface of the wafer (e.g., back surface of substrate 420) with the same type of dopant.

Solar cell 400 may further include antireflective coating 430 on its front surface and passivation layer 450 on its back surface. As discussed above, antireflective layer 430 also functions as a passivation layer for the front surface. Antireflective layer 430 may be formed of silicon nitride (e.g., Si3N4). Passivation layer 450 may be formed of silicon dioxide (e.g., SiO2) or silicon nitride (e.g., Si3N4). Solar cell 400 may further include metal layer 460. Metal layer 460 may be formed of aluminum or another metal. Metal layer 460 contacts BSF layer 440 via contact holes 470 in passivation layer 450.

Embodiments of the present invention may be used in conjunction with any suitable solar cell configuration. For example, in some embodiments of the present invention, the back surface field layer 440 needs not cover the entire back surface area of a wafer (e.g., substrate). Covering only a portion of the substrate simplifies the manufacturing process and reduces cost by reducing or eliminating a high-temperature diffusion or a high-dose ion implantation required to form the back surface field layer.

Adding a charge to a passivation layer (e.g., negative charge in layer 240 for P-type base 220, positive charge in layer 340 for N-type base 320), according to various aspects of the present invention, may be used to accumulate majority carriers (e.g., holes for P-type base 220, electrons for N-type base 320) and to repel minority carriers (e.g., electrons for P-type base 220, holes for N-type base 320) thereby forming an effective BSF layer without using a heavy doping process.

Another solar cell configuration, shown in FIG. 4B, may be used in conjunction with the present invention. Solar cell 475 is an N-type cell that includes P+ emitter 476 and N-type base 477. Cell 475 further includes BSF 479 formed of an N-type semiconductor material, interfacial layer 481 (e.g., front) adjacent to the emitter 476, and passivation layer 483 (e.g., back) adjacent to the BSF 479. Interfacial layer 481 and passivation layer 483 are preferably formed of silicon dioxide (e.g., SiO2); however, any suitable material may be used. Passivation layer 485 is preferably formed of silicon nitride (e.g., Si3N4), but any suitable material may be used. Cell 475 further includes antireflective layer 485 adjacent to interfacial layer 481.

Antireflective layer 485 is preferably negatively charged, as shown in FIG. 4B, for more effective surface passivation and higher cell efficiency as discussed above. In one embodiment, antireflective layer 485 is formed from silicon nitride (e.g., Si3N4) and may be negatively charged as further discussed below. Using silicon dioxide (e.g., SiO2) as the material for interfacial layer 481 and back passivation 483 layers helps prevent charge loss in antireflective layer 485 and allows the cell 475 to be formed without the need for a silicon nitride (e.g., Si3N4) layer on the back side of the wafer.

Another solar cell configuration, shown in FIG. 4C, may be used in conjunction with the present invention. Solar cell 490 is a P-type cell that includes N+ emitter 491 and P-type base 492. Cell 490 further includes BSF 493 formed from a P-type semiconductor material, interfacial layer 494 (e.g., front) adjacent to the emitter 491 and interfacial layer 495 (e.g., back) adjacent to the BSF 493. Interfacial layers 494 and 495 are preferably formed of silicon dioxide (e.g., SiO2) although any suitable material may be used. Cell 490 further includes antireflective layer 496 (e.g., front) adjacent to interfacial layer 494 and passivation layer 497 (e.g., back) adjacent to interfacial layer 495. Antireflective layer 496 is preferably positively charged and passivation layer 497 is preferably negatively charged, as shown in FIG. 4C, for more effective surface passivation and higher cell efficiency. Layers 496 and 497 may be formed from the same or different material. In one embodiment, layers 496 and 497 are formed of silicon nitride (e.g., Si3N4).

According to various aspects of the present invention, material used for passivation, and/or antireflective (e.g., dielectric) layers preferably may store a charge. As discussed above, storing a charge in a layer adjacent and/or proximate to an emitter, a base, and/or a BSF layer increases the efficiency of the solar cell. Materials that are suitable for performing the functions of a passivation and/or antireflective layer and storing a charge include silicon nitride (e.g., Si3N4), aluminum oxide (Al2O3), zirconium oxide (ZrO2), and hafnium oxide (HfO2).

Silicon nitride (e.g., Si3N4) has been used as the material that stores charge in the nitride layer of a Silicon-Oxide-Nitride-Oxide-Silicon (e.g., SONOS) structure of a non-volatile memory. In SONOS non-volatile operation, a positive, with respect to the silicon substrate, biasing pulse applied to a control gate (e.g., gate electrode, gate) causes the silicon nitride (e.g., Si3N4) layer to store negative charges (e.g. electrons). Applying the positive biasing pulse to the control gate is referred to as "programming" the SONOS non-volatile memory cell. Conversely, applying a negative biasing pulse to the control gate causes the silicon nitride (e.g., Si3N4) layer to remove pre-existing negative charges from the Si3N4 and to store positive charges (e.g., holes). Applying the negative biasing pulse to the control gate is referred to as "erasing" the SONOS non-volatile memory cell.

In a solar cell, there is no gate electrode for applying an external bias to charge a silicon nitride (e.g., Si3N4) layer, so a different method must be used to charge a silicon nitride (e.g., Si3N4) passivation layer, or any other layer, of the solar cell. According to various aspects of the present invention, a solar cell (e.g., wafer containing solar cells) may be electrically biased in the presence of a plasma to transfer charge from the plasma to the dielectric layer to store a charge in the layer. In accordance with various aspects of the present invention, a passivation layer formed of a material (e.g., Si3N4) that is capable of storing a charge (e.g., positive, negative) may be applied as both front and back passivation and/or front antireflective layers of a solar cell. The front or the back passivation layer of a solar cell may be charged, either positively or negatively, at any suitable point during the manufacture of the solar cell.

For example, an apparatus for charging a passivation layer may be added to a PECVD (plasma-enhanced chemical vapor deposition) tool. The apparatus may both deposit and charge a passivation and/or antireflective (e.g., dielectric) layer in-situ. Alternatively, a layer of a solar cell wafer may be charged by a stand-alone tool during processing of the solar cell.

A conventional system for PECVD is shown in FIG. 5 as system 500. System 500 includes a chamber 510, gas inlet 520, and gas outlet 530. RF power supply 540 is in electrical communication with one or more plasma-generating electrodes 575. Electrode 570 supports and is in electrical communication with solar cell wafer 580.

The system 500 may, among other things, deposit a passivation/antireflective layer onto solar cell wafer 580. To deposit a layer on solar cell wafer 580, chamber 510 is evacuated using gas outlet 530 and a gas comprising silane (e.g., SiH4) and ammonia (e.g., NH3) is injected into the chamber via gas inlet 520. Power (e.g., a signal) from the RF power supply 540 is applied to the electrode (e.g., RF electrode) 575 to generate plasma 590 by ionizing the silane/ammonia gas. The RF power (e.g., signal) from RF power supply 540 creates an electric field as a result of plasma sheath potential build-up between plasma 590 and bottom electrode 570. Electrode 570 may also be referred to as a ground electrode or ground plate because it is coupled to ground (e.g., system ground). The electric field between plasma 590 and ground plate 570 causes ions containing silicon and nitrogen atoms to stream down from plasma 590 to the surface of solar cell wafer 580 thereby depositing a silicon nitride (e.g., SiNx) layer on solar cell wafer 580. The silicon nitride (e.g., SiNx) layer may function as a passivation and/or antireflective layer on the solar cell 580 as discussed above.

A passivation layer may be charged after being deposition by PECVD. A passivation layer may be charged to store a positive charge or a negative charge. A passivation layer deposited adjacent or proximate to N-type semiconductor material may be charged to store a positive charge (e.g., layers 230, 340, 496). A passivation layer deposited adjacent or proximate to P-type semiconductor material may be charged to store a negative charge (e.g., layers 240, 330, 497).

System 600, referring to FIG. 6, may be used to deposit a layer (e.g., passivation, antireflective layer) on solar cell wafer 580 or to perform in-situ charging of a deposited layer. System 600, according to various aspects of the present invention, includes DC power supply 610 and switch 620 to provide layer deposition and/or in-situ charging of a deposited passivation layer (e.g., front, back) of solar cell wafer 580. During in-situ deposition and charging, the surface of the wafer where the layer is being deposited and/or charged faces toward the plasma while the opposite side of the wafer is oriented toward and is in electrical contact with the electrode that is electrically coupled to the DC power supply.

In an implementation according to various aspects of the invention, DC power supply 610 is coupled to electrode 570 via switch 620. Switch 620 may couple electrode 570 to electrical ground or DC power supply 610. Coupling electrode 570 to electrical ground accomplishes deposition of a layer (e.g., passivation, antireflective, dielectric) on solar cell wafer 580. Coupling electrode 570 to DC power supply 610 and operating DC power supply 610 accomplishes in-situ charging (e.g., positive, negative) of a deposited layer.

During deposition of a layer, as discussed above, switch 620 electrically couples electrode (e.g., ground plate) 570 to electrical ground and silane (e.g., SiH4) and ammonia (e.g., NH3) gas fills chamber 510. Once a layer is deposited, the layer may be charged while solar cell wafer 580 is still positioned in chamber 510. Charging is accomplished by evacuating the silane (e.g., SiH4) and ammonia (e.g., NH3) gas out of chamber 510 via gas outlet 530. A different gas is introduced into chamber 510 via gas inlet 520. Power (e.g., signal) from RF power supply 540 is applied to RF electrode 575 to produce plasma 630.

Plasma 630 includes charge particles (e.g., electrons, positive ions) and emits light (e.g., photons). Preferably, the gas used to produce plasma 630 emits some ultraviolet light. Photons having a magnitude of energy (e.g., energy level) less than the band gap of a layer (e.g., passivation, antireflective, dielectric) may pass through the layer to the surface of the silicon. A photon that reaches the surface of the silicon may generate electron-hole pairs. Preferably, the energy level of the photons from the ultraviolet light of plasma 630 is about 3.0 eV (e.g., electron-volts), which is less than the band gap of a silicon nitride (e.g., SiNx) layer.

Photons having an energy level sufficiently greater than the band gap of the silicon nitride (e.g., SiNx) layer do not pass through the layer, but are absorbed by the layer, generating free electron-hole pairs in the layer. Absorption of photons by a layer may interfere with retention of a charge by the layer. In other words, photons of a higher energy level may interfere with charging a layer as opposed to cooperating to charge the layer.

For a layer formed of silicon nitride (e.g., SiNx), photons having an energy level of between about 3 eV and 4 eV cooperate in charging a layer (e.g., passivation, antireflective, dielectric) because the photons pass through the layer to generate electron-hole pairs at the surface of the silicon. Photons having an energy level of greater than about 4 eV are less likely to cooperate to charge the layer because they are absorbed by the layer and such absorption may impair (e.g., reduce, interfere with) the charge stored in the layer or the process of storing charge in the layer. Photons having an energy level of less than about 3.0 eV may pass through the layer and are absorbed in the silicon substrate, contributing to the generation of electricity. Such low energy photons neither cooperate in charging the layer nor interfere with pre-existing charges in the layer.

In one implementation, the energy level of the photons from (e.g., generated by) plasma 630 is at least about 3 eV. In another implementation, the energy level of the photons from plasma 630 is at least about 3.1 eV. In another implementation, the energy level of the photons from plasma 630 is less than about 4 eV.

Inert gases such as nitrogen, argon, and/or helium are suitable for generating a plasma that provides (e.g., generates) charged particles (e.g., electrons, positive ions) and photons having a desired energy level for charging, but that does not lead to any parasitic film deposition. Embodiments of the present invention are not restricted to using a gas that provides a plasma that generates a light with any particular energy level or wavelength.

Charging a passivation layer may be accomplished by switching switch 620 to electrically couple DC power supply 610 to electrode 570. When DC power supply 610 is electrically coupled to electrode 570, electrode 570 may be referred to as a charging electrode, or a charging plate. DC power supply 610 may provide a voltage pulse to electrode 570 to generate an electric field between the electrode 570 and plasma 630. Because wafer 580 is electrically coupled to electrode 570, the electric field is also established between wafer 580 and plasma 630. The electric field generated by the pulse results in charging, positively or negatively, the front (e.g., top, distal to electrode 570, proximate to plasma 630) layer (e.g., passivation, antireflective, dielectric) of solar cell wafer 580.

A pulse may have a starting time and an ending time. Prior to the starting time, the magnitude of the output of DC power supply 610 is substantially the same as the magnitude of the ground (e.g., system ground) connected to DC power supply 610. At the starting time, the magnitude of the output of DC power supply 610 increases (e.g., positive bias) above ground or decreases (e.g., negative bias) below ground until it reaches the pre-determined magnitude of the pulse. Between the starting time and the ending time, the magnitude of the output of DC power supply 610 remains substantially constant. At the ending time of the pulse, the magnitude of the output of DC power supply 610 returns to the magnitude of ground, or electrode 570 may be disconnected (e.g., floated) from DC power supply 610. The time between the starting time and the ending time is the duration of the pulse. The pulse provided by DC power supply 610 may be of a predetermined duration. The pulse provided by DC power supply 610 may be of a predetermined magnitude.

Because, in this implementation, the magnitude of the output of DC power supply 610 remains substantially constant for the duration of the pulse, the pulse may be referred to as a DC pulse. However, the above disclosure regarding the shape of a pulse provided by DC power supply 610 is not intended to limit the characteristics of the pulse that may be provided to charge a layer. The term pulse includes an electrical signal having any characteristics that biases a wafer in such a manner as to attract charged particles from a plasma to charge a layer of the wafer.

A DC power supply may include any conventional programmable power supply.

The polarity of the charge stored in the front layer of wafer 580 is responsive to the polarity of the pulse provided by DC power supply 610 and may be further responsive to the photons generated by the plasma as discussed below. The pulse may be positively or negatively biased with respect to ground to negatively charge a layer. An electric field established by the pulse between wafer 580 and plasma 630 interacts with charged particles from plasma 630 to charge the front layer of wafer 580. The interaction with charged particles may include moving a particle of a particular polarity from the plasma to the front layer of wafer 580. Interaction may further include interaction of the charged particles with electron-hole pairs created in the silicon surface region of wafer 580 by the photons generated by the plasma.

System 600 may negatively charge a front layer (e.g., passivation, antireflective, dielectric). Negatively charging a layer may include negatively charging a layer that has a positive charge as deposited. If the pulse is positively biased, it is believed that electrons are extracted (e.g., moved, accelerated, attracted) from the plasma and are injected into the front layer (e.g., top surface) of solar cell wafer 580 to negatively charge the layer.

A front layer may include a layer (e.g., dielectric) that is positioned (e.g., sandwiched, stacked) between oxide layers. For example, a stacked passivation structure may include a silicon nitride (e.g., nitride, SiNx) layer positioned between silicon oxide (e.g., oxide, SiOx) layers (e.g., top oxide/ nitride/bottom oxide). The stacked passivation may be positioned on the front (e.g., top with respect to plasma 630) of the wafer.

A negative bias pulse may be used to negatively charge the nitride (e.g., SiNx) layer of the stacked passivation structure. When a negative bias pulse is applied to a wafer that includes a stacked passivation, it is believed that positive ions extracted from the plasma are accelerated and introduced onto the surface (e.g., oxide layer) of the front layer. The ions in a surface region of the front layer form (e.g., establish, create) an electric field across the stacked layers. Photons from the plasma pass through the stacked layers to generate electron-hole pairs at the surface of the underlying semiconductor. The electric field created by the positive ions pulls the photo-generated electrons into the nitride layer through the thin bottom oxide (e.g., SiOx) layer. The electrons pulled from the silicon into the nitride layer negatively charge the nitride layer. A function performed by the top oxide (e.g., SiOx) layer may include reducing the loss of negative charge (e.g., electrons) from the nitride layer. If there is no top oxide layer in the stacked structure, negative charges (e.g., electrons) may easily move from the nitride to the surface where positive ions sit. Once electrons reach positive ions, they disappear through recombination with the positive ions. However, if there is a top oxide layer, electrons may not move from the nitride to the surface of the top layer of the stack but instead are confined in the nitride (e.g., SiNx) as a result of an energy barrier provided by the oxide. Therefore, the negative charge loss by the recombination with positive ions at the front (e.g., top) oxide surface is significantly reduced. Once charging the silicon nitride (e.g., SiNx) layer is accomplished, the positive ions sitting on the front oxide (e.g., SiOx) layer need to be neutralized with plasma electrons by subsequently applying a short positive bias pulse or by spraying of IPA (e.g., isopropyl alcohol) in air.

System 600 may positively charge a front layer (e.g., passivation, antireflective, dielectric). Positively charging a layer may include positively charging a layer that has a negative charge as deposited. Some passivation materials (e.g., aluminum oxide) are negatively charged when deposited as a layer on a solar cell. To change the negative charge of a front layer into a positive charge, DC power supply 610 provides a negatively biased pulse. As discussed above, applying the negatively biased pulse to wafer 580 via electrode 570 extracts positive ions from the plasma and accelerates them onto the surface of the layer. The positive ions in a surface region of the layer remove electrons from the passivation layer by recombination of the electrons moving from the layer with the positive ions in the surface region. As a result, a previously negatively charged passivation layer is positively charged to the extent that the amount of positive ions introduced onto the front passivation layer is greater than the amount of pre-existing negative charge of the layer. This method may also be used, for example, to increase more net positive charge in silicon nitride (e.g., SiNx) than its as-deposited positive charge density.

A DC power supply may provide a pulse, whether negatively or positively biased, having a pulse duration in the range of a few (e.g., 1) microseconds to a few hundred (e.g., 500) seconds. A pulse may be produced by a DC power supply by switching the supply to an active operating state (e.g., on) for the duration of the pulse followed by switching the power supply to an inactive operating state (e.g., off) to terminate the pulse. A magnitude of a pulse provided by a DC power supply may be in the range of a few volts (e.g., 1V) to several thousands of volts (e.g., 5,000V).

In another embodiment, referring now to FIG. 7, system 700 illustrates a stand-alone system for charging a passivation layer of a solar cell. In this embodiment, charging electrode 570 is electrically coupled to DC power supply 610. System 700 is not configured to perform the PECVD deposition of layers, but instead only uses nitrogen, argon, or helium gas to generate a plasma to charge an already-deposited layer (e.g., passivation, antireflective) of solar cell wafer 580. The charging function of system 700 operates as described above for system 600. Standalone system 700 may not require vacuum for the system operation but may operate at the atmospheric pressure or subatmospheric pressure. A vacuum operation generally costs more than an atmospheric operation. System 700 may be used as a separate charging chamber which may be added to a system having a PECVD chamber for depositing the layer. A separate charging chamber permits sequential operation for deposition and charging without vacuum breaking.

Figure 8:
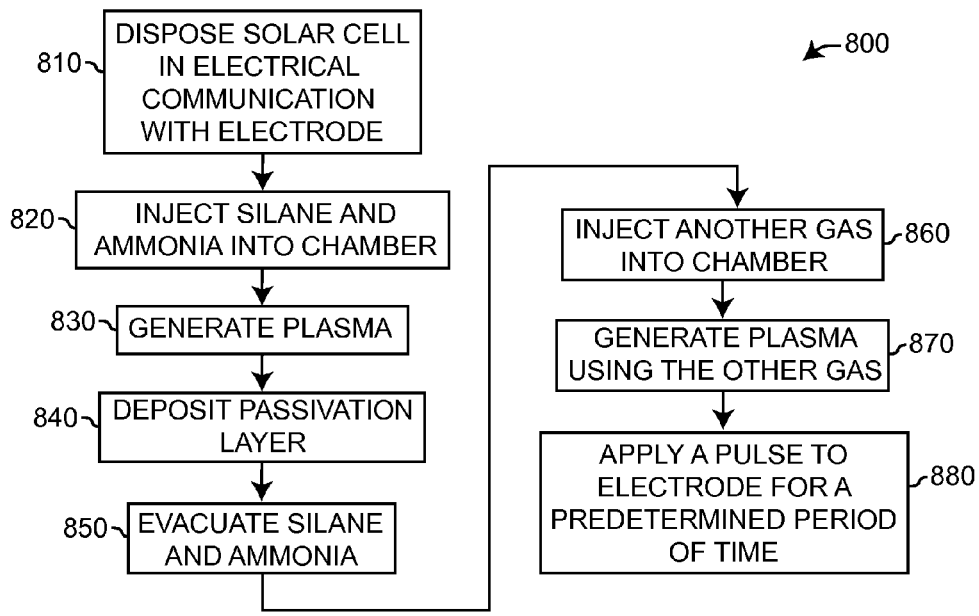
FIG. 8 depicts a flow diagram of a method for charging a passivation layer of a solar cell according to various aspects of the present invention.

A method for charging a passivation layer of a solar cell is provided in FIG. 8. Method 800 may be performed, in whole or in part, using any suitable system, including systems 600 and 700 shown in FIGS. 6 and 7. Method 800 includes steps dispose 810, inject 820, generate 830, deposit 840, evacuate 850, inject 860, generate 870, and apply 880. Steps 810-880 may be wholly or partially performed by conventional equipment used in a semiconductor fabrication facility. Method 800 may be wholly automated using machines or may include steps performed by human operators. Any conventional control circuit (e.g., computer, processor, programmable logic) may be used to control the performance of any or all steps. A control circuit may perform any calculations required to, according to various aspect of the present invention, apply a pulse to charge a dielectric layer.

In dispose step 810, a solar cell is disposed within a chamber and in electrical communication with an electrode, such as charging electrode 570. Disposition of a solar cell wafer into a chamber may be mechanically automated using conventional semiconductor equipment.

In inject step 820, silane (e.g., SiH4) and ammonia (e.g., NH3) gas is injected into a chamber, such as chamber 510. Control of the filling and vacating chamber 510 may be automated using conventional semiconductor equipment.

In generate step 830, a plasma is generated using the silane and ammonia gas. RF power supply 540 and an electrode 575 in cooperation with electrode 570 may be used to generate the plasma from the gas. Operation of an RF power supply may be controlled by a processing circuit. Control may include generating a plasma that provides photons of a minimum energy.

In deposit step 840, the plasma deposits a layer (e.g., passivation, antireflective, dielectric) on solar cell wafer 580. Deposition may be controlled by a processing circuit to provide a layer of a desired thickness and/or density.

In evacuate step 850, the silane (e.g., SiH4) and ammonia (e.g., NH3) gas is evacuated from the chamber. As discussed above vacating the chamber may be automated using conventional semiconductor equipment.

In inject step 860, another gas, such as an inert gas or gasses such as argon, nitrogen, and/or helium, is injected into the chamber. As discussed above filling the chamber with a gas may be automated using conventional semiconductor equipment.

In generate step 870, a plasma is generated using the other gas. A processing circuit may control RF power supply 540 to produce a plasma with photons having a certain energy level. A control circuit may coordinate the control of RF power supply 540 and DC power supply 610 to charge a layer to a particular polarity.

In apply step 880, a pulse of a predetermined magnitude is applied to a charging electrode (e.g., 570, 1270) for a predetermined period of time (e.g., duration). The pulse creates (e.g., establishes, sets up, creates) an electric field that interacts with (e.g., moves, accelerates) the charged particles (e.g., electrons, positive ions) of the plasma created in generate step 870 to charge the layer with a positive or a negative charge depending on the polarity of the pulse with photon assistance in some cases. A processing circuit may determine the duration of the pulse. A processing circuit may determine the polarity and magnitude of the pulse.

Removal of the wafer from the chamber may further be performed in an automated fashion by conventional semiconductor equipment. In an equipment configuration in which the deposition of a layer and the charging of the layer (e.g., FIG. 7) are performed in separate chambers, transfer of the wafer from one chamber to the next may be accomplished in an automated fashion using conventional semiconductor equipment.

The functions performed by a passivation layer are discussed below. Passivation may include chemical passivation and field-effect passivation as discussed above. Chemical passivation may include depositing a layer of material on a semiconductor surface. Material of the passivation layer may structurally and/or chemically cooperate with the underlying silicon material to protect the silicon surface by coating the silicon surface. Material suitable for chemical passivation may include Si3N4 and SiO2.

A thermally grown SiO2 or a deposited SiO2 followed by a high-temperature process step such as a contact firing step may give much better chemical passivation than Si3N4 (typically deposited by PECVD) whereas Si3N4 film may be much more suitable for charging and thus for field-effect passivation. S3N4 is also more suitable for antireflective coating on light-incident surface of a solar cell. A Si3N4/SiO2 stack may give the advantages of two individual films for chemical and field-effect passivation. In addition, a SiO2 interfacial layer may provide an energy barrier for charge movement from the charged layer (Si3N4) to the semiconductor substrate, thereby significantly reducing the charge loss of the charged layer. Chemical passivation may reduce the density of defects at a surface thereby reducing surface recombination and improving the electrical operation of the solar cell. Field-effect passivation may repel minority carriers away from the defective surface thereby reducing surface recombination, acting like a surface field effect by a heavy doping near the semiconductor surface.

Figure 9:
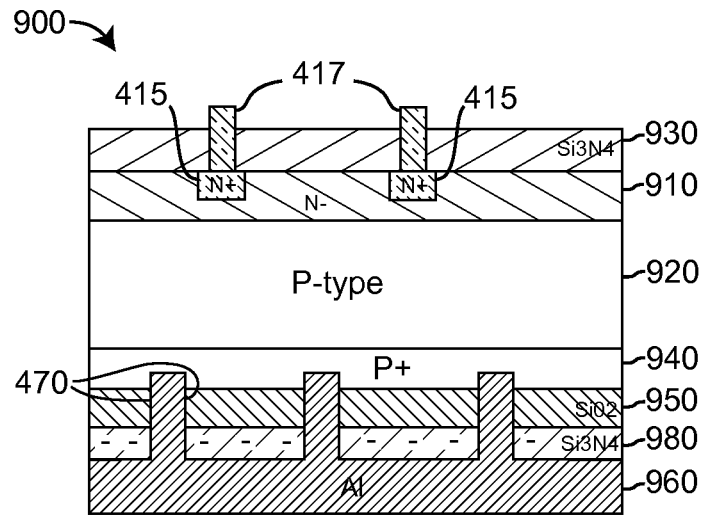
FIGS. 9 and 10 are schematic views of vertical cross-sections of solar cells according to various aspects of the present invention.

For example, solar cell 900 of FIG. 9 is an implementation of solar cell 400, and is called a PERC (i.e., passivated emitter and rear cell) cell. Substrate 920 is formed of P-type silicon material that operates as the base of the solar cell. Lightly doped N-type emitter layer 910 cooperates with heavily doped N-type emitters 415 to perform the functions of the emitter of solar cell 900. Heavily doped P-type layer 940 performs the function of the back-surface field ("BSF"). Aluminum layer 960 couples to BSF layer 940 to cooperate with substrate 920 to perform the function of the base. Layers 930 and 950 perform the function of a chemical passivation layer and are deposited on the front side and the backside of substrate 920 respectively. Layer 930 reduces recombination at the surface of the lightly doped emitter 910. Layer 950 reduces recombination at the back surface of the BSF 940. Layer 930 may be formed of Si3N4. Layer 950 may be formed of SiO2.

Field effect passivation may include depositing a layer of material that can be charged. A charged layer may be deposited adjacent to a passivation layer. The charge in the charged layer establishes an accumulation region at the silicon surface by electric field effect through the adjacent oxide passivation layer that may further reduce surface recombination. For example, layer 950 performs the function of a chemical passivation layer with respect to semiconductor layer 940. The charges in layer 980 operate to perform the function of a field effect passivation. Layer 980 may be formed of Si3N4. The negative charge injected into layer 980 attracts holes (e.g., majority carrier) to the surface between layers 940 and 950, but repels electrons (e.g., minority carrier) from the surface, thereby further reducing surface recombination and further improving the efficiency of the solar cell.

A charged layer adjacent to a metal layer may result in a permanent loss of charge, over time, from the charged layer as the charge migrates from the charged layer into the metal layer. For example, the negative charges of charged layer 980 may migrate from charged layer 980 and enter into metal layer 960. Metal layer 960 may be formed of aluminum. Charge loss from a charged layer to a metal layer may be reduced by adding an energy barrier layer such as a SiO2 layer between the charged layer and the metal layer to suppress charge migration.

Figure 10:
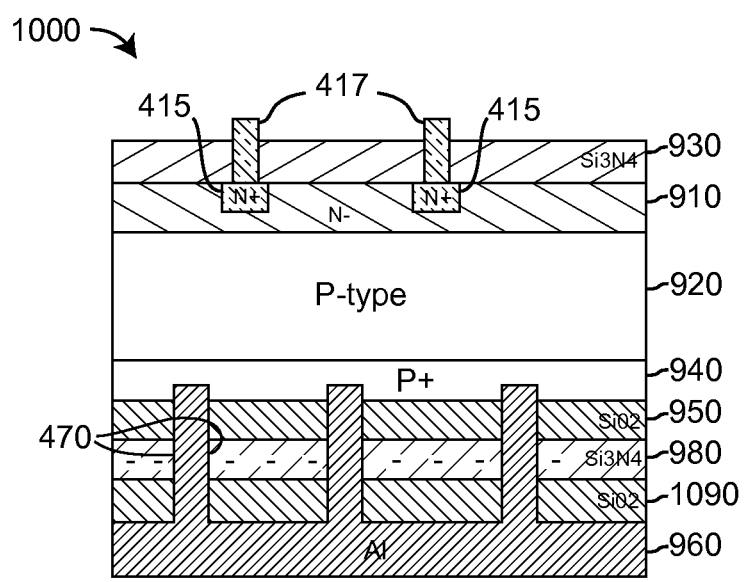

For example, charged layer 980 is separated, for the most part, from metal layer 960 by intervening an energy barrier layer 1090 shown in FIG. 10. The barrier layer 1090 may be formed of SiO2. Barrier layer 1090 significantly reduces the migration of charge from charged layer 980 into metal layer 960. Metal layer 960 still has some contact with charged layer 980 at contact holes 470; however, the amount of surface area between layer 980 and metal layer 960 at contact holes 470 is small, so the loss of charge through this small area is negligibly small.

A system for depositing and charging layers, such as system 600, or for charging only of a layer, such as system 700, may further include a choke circuit. As discussed above, a system that charges a layer includes a DC power supply (e.g., DC power supply 610) for providing a pulse (e.g., DC pulse). The pulse establishes an electric field between the plasma (e.g., 630) and wafer 580 via the charging electrode (e.g., 570). The pulse used to charge a layer is applied while the plasma-generating RF power supply operates to create the plasma.

The choke circuits operates to separate the AC circuit (e.g., RF power supply 540, electrode 575, electrode 570, system ground) used to generate the plasma from the DC circuit (e.g., DC power supply 610, electrode 570, system ground) that provides the pulse to charge a layer. The choke circuit operates to suppress (e.g., block) the effects of the DC power supply (e.g., 610) on the RF power supply (e.g., 540) or to separate (e.g., isolate) the DC power supply circuit from the RF power supply circuit and vice versa. Reducing the effect that DC power supply 610 may have on the power (e.g., signal) provided by RF power supply 540 reduces unwanted high-frequency interaction by the RF signal thereby increasing the stability of plasma 630. Reducing unwanted high-frequency interaction with the power provided by RF power supply 540 reduces a damage to DC power supply 610.

A choke circuit operates as a high-frequency blocking filter. A choke circuit uses an electrical circuit to block higher-frequency alternating current (e.g., AC) signals and to pass lower frequency signals. A choke circuit may be adapted to block AC signals in a frequency range produced by the RF power supply used to produce a plasma. A chock circuit may include any circuit and/or structure of a conventional choke circuit and/or low-pass filter.

The choke circuit operates to electrically connect ground plate 570 to system ground for the AC operation of RF power supply 540 to provide an AC ground for the operation of the AC circuit. RF power supply 540 establishes an electric field between electrode 575 and ground plate 570 (e.g., AC ground) to generate plasma 630. The choke further operates to electrically connect charging plate 570 to DC power supply 610 for the DC operation of the DC circuit. The choke separates, to some extent, the operation of the AC circuit from the operation of the DC circuit.

Figure 11:
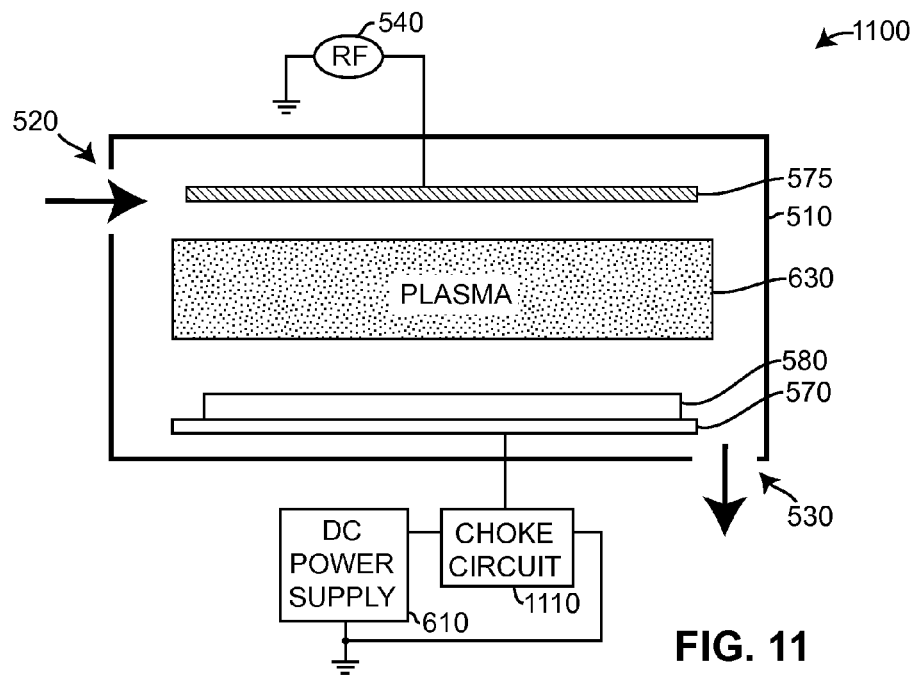
FIG. 11 depicts a system for charging a passivation layer of a solar cell according to various aspects of the present invention.

In an implementation, referring to FIG. 11, PECVD system 1100 includes DC power supply 610, RF power supply 540, and choke 1110. Choke circuit 1110 electrically separates the AC circuit used by RF power supply 540 to generate the plasma and the DC circuit used to provide the pulse to ground plate 570 for charging a layer. Separating the RF power supply circuit from the DC power supply circuit protects DC power supply 610 from being damaged by the high power provided by RF power supply 540.

A PECVD system, according to various aspects of the present invention, may further include a plasma generation configuration using two separate plates (e.g., electrodes) to apply RF power which allows the charging plate (e.g., electrode) to be electrically separate (e.g., disconnected, isolated) from the RF power supply.

Figure 12:
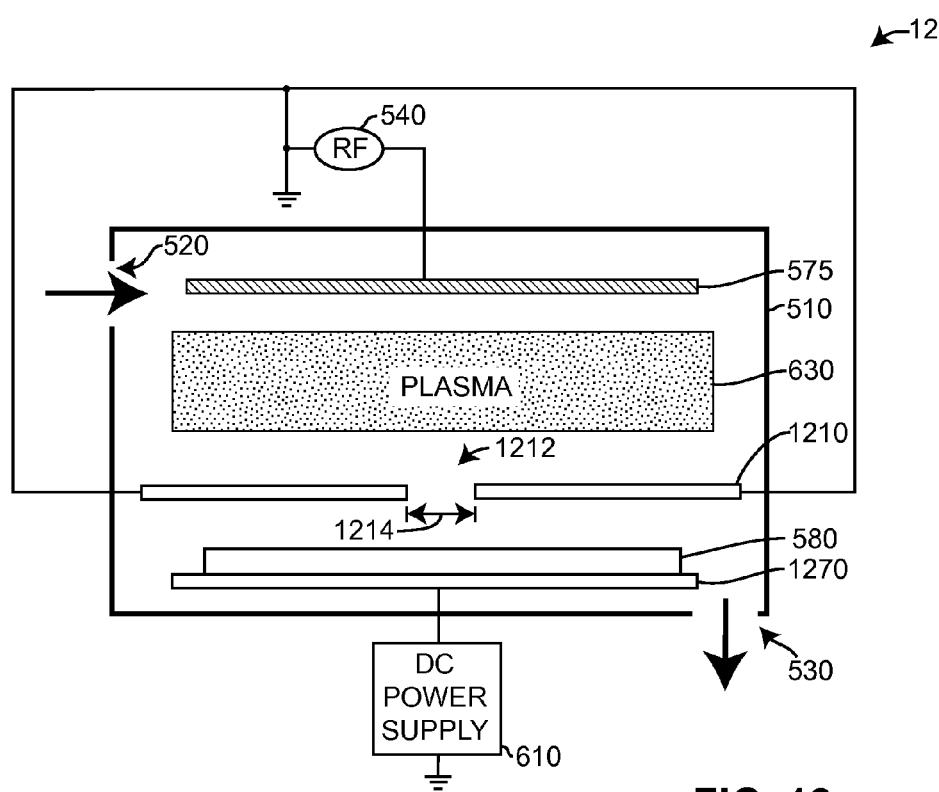
FIG. 12 depicts a system that includes two parallel plates for applying plasma-generating RF power (e.g., signal) which are electrically separated from the charging electrode for charging a passivation layer of a solar cell according to various aspects of the present invention.

Plate 1210, of FIG. 12, may be referred to as an RF ground plate (e.g., plane) or ground plate because it electrically couples to system ground. Plate 1270 of systems 1200-1300 is referred to as a charging plate because it is used to bias wafer 580 to charge a layer of wafer 580. In systems 1200-1300, unlike in systems 600-700 and 1100, plate 1270 is not used to generate the plasma, but only for charging a layer of wafer 580.

For example, a charging system 1200 has two separate parallel plates 575 and 1210 for applying plasma generating RF power to generate plasma 630. Charging system 1200 further includes charging plate 1270 for applying a pulse to charge a layer of wafer 580. In this implementation, charging plate 1270 is parallel to plates 575 and 1210 thereby positioning wafer 580 parallel to ground plate 1210. Separating the plasma generation circuit (e.g., RF power supply 540, plate 575, plasma 630, plate 1210, system ground) from the charging circuit (e.g., DC power supply 610, plate 1270, wafer 580, system ground) increases the stability of the plasma used to charge a dielectric layer on wafer 580. Because the plasma generation circuit is separate from the charging circuit, a choke circuit (e.g., 1110) may not be needed because DC power supply 610 is electrically separate (e.g., isolate) from RF power supply 540.

Ground plate 1210 may include one or more openings (e.g., perforations, slots, slits) that permit charged particles (e.g., electrons, ions) and photons to move from the plasma through the openings to the layer being charged on wafer 580. A ground plate may be formed of a mesh-like material to provide multiple openings for charged particles and photons to pass through. As discussed above, the bias applied to a charging plate (e.g., 1270) and wafer 580 by DC power supply 610 establishes an electric field that moves charged particles from plasma 630 to the surface of wafer 580 via the one or more openings in ground plate 1210.

An opening in a ground plate may have a width and a length. The length of an opening may be greater than the width of the opening. The length of an opening may equal to or greater than the diameter of one or more wafers. A wafer may be moved (e.g., via moving charging plate 1270) with respect to an opening in a ground plate so that the opening may be positioned above any part of the wafer. In one implementation, the speed of movement of charging plate 1270, and thereby the wafer, is in accordance with the amount of charge being transferred to the layer on the wafer. The ground plate may move so that the entire layer on the wafer is uniformly charged.

For example, width 1214 of opening 1212 may be less than the length (not shown, but perpendicular to the page) of the opening. The dimensions of the objects in FIG. 12 are not to scale. In one implementation of ground plate 1210, width 1214 is about one inch and the length of opening 1212 is greater than the diameter of a conventional silicon wafer. Charging plate 1270 moves so that at least a portion of opening 1212 is positioned above all portions of wafer 580. The speed of movement and the amount of time opening 1212 is positioned above any portion of wafer 580 is proportional to the amount of charge being transferred to the top layer of wafer 580. Uniform charging of the top layer on wafer 580 may be accomplished by moving charging plate 1270 with respect to plasma 630 to position opening 1212 over each portion of wafer 580 for approximately the same amount of time. The speed of movement of wafer 580 with respect to opening 1212 may further be in accordance with the magnitude of the bias on wafer 580 that is provided by DC power supply 610.

Figure 13:
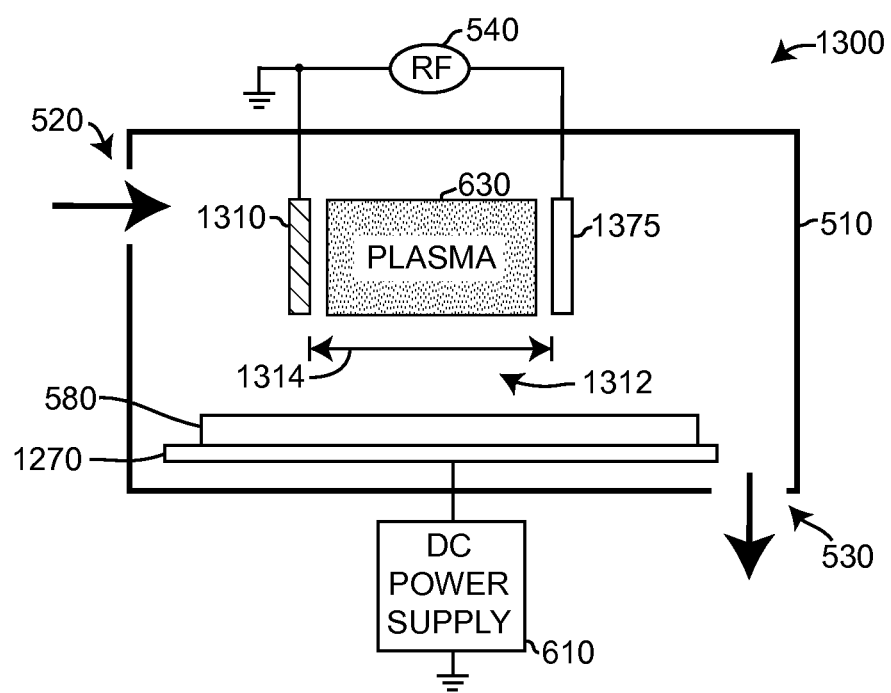
FIG. 13 depicts another system that has two parallel plates for applying plasma-generating RF power that are electrically separated from the charging electrode for charging a passivation layer of a solar cell according to various aspects of the present invention.

In another exemplary charging system, system 1300 of FIG. 13 includes two plates 1375 and 1310 for applying the power from RF power supply 540 to generate plasma 630. The planes of plates 1375 and 1310 are parallel to each other, but are oriented vertically (e.g., orthogonally) to wafer 580. Plasma 630 is confined (e.g., established, generated, formed) between plates 1375 and 1310. System 1300 further includes charging plate (e.g., electrode) 1270 for applying a bias pulse to charge the top surface of wafer 1270. As in system 1200, the plasma generation circuit (e.g., RF power supply 540, plate 1375, plasma 630, plate 1310, system ground) of system 1300 is separate (e.g., disconnect, isolate) from the charging circuit (e.g., DC power supply 610, plate 1270, wafer 580, system ground) thereby increasing the stability of the plasma and reducing or eliminating the need for a choke circuit to protect DC power supply 610. The plasma generating and charging functions performed by system 1300 are the same as the plasma generating and charging functions discussed above.

Opening 1312 between plates 1310 and 1375 permit charge particles and photons to move from plasma 630 onto the surface of wafer 580 to charge the top layer of wafer 580 while a bias pulse is applied to charging electrode 1270 as discussed above. Distance 1314 between plates 1310 and 1375 may be less than the length (not shown, but parallel to the page) of plates 1310 and 1375. The objects shown in FIG. 13 are not to scale. The length of the plates may be equal to or greater than the diameter of one or more wafers as discussed above. Distance 1314 may be less than the diameter of a single wafer or greater than the diameter of one or more wafers.

If distance 1314 is less than the width of a wafer, wafer 580 may be moved with respect to opening 1312 to position each portion of wafer 580 below opening 1312 to charge the top layer of wafer 580. Speed of movement of wafer 580 with respect to opening 1312 and/or the magnitude of the bias voltage provided by DC power supply 610 may be in accordance with the amount of charge to be deposited on wafer 580 as discussed above.

The particular implementations shown and described above are illustrative of the invention and its best mode and are not intended to limit the scope of the present invention in any way. Indeed, for the sake of brevity, conventional semi-conductor equipment, data storage, data transmission, and other functional aspects of the systems may not be described in detail. Methods illustrated in the various figures may include more, fewer, or other steps. Additionally, steps may be performed in any suitable order without departing from the scope of the invention. The connecting lines shown in the various figures are intended to represent exemplary functional relationships and/or physical couplings between the various elements. Many alternative and/or additional functional relationships or physical connections may be present in a practical system.

The foregoing description discusses preferred embodiments of the present invention, which may be changed or modified without departing from the scope of the present invention as defined in the claims. Examples listed in parentheses may be used in the alternative or in any practical combination. As used in the specification and claims, the words 'comprising', 'including', and 'having' introduce an open-ended statement of component structures and/or functions. In the specification and claims, the words 'a' and 'an' are used as indefinite articles meaning 'one or more'. A cross-hatch pattern on a cross-section drawing is not an indication of material type, but merely for distinguishing one layer from another layer. While for the sake of clarity of description, several specific embodiments of the invention have been described, the scope of the invention is intended to be measured by the claims as set forth below.

What is claimed is:

1. A method, performed by a system, for charging a layer of a wafer, the method comprising:
   forming the layer on the wafer, the layer comprising no permanently stored charge;
   generating a plasma from an inert gas, the plasma comprising electrons and positive ions, the wafer positioned proximate to the plasma, the layer oriented toward the plasma;
   providing a pulse to the wafer to electrically bias the wafer; and responsive to the electrical bias, extracting at least one of electrons and positive ions from the plasma to substantially permanently charge the layer of the wafer.

2. The method of claim 1 wherein:
   the plasma further comprises photons having a magnitude of energy of about 3 eV; and
   the photons from the plasma generate electron-hole pairs in the silicon that cooperate with the at least one of electrons and positive ions extracted from the plasma to charge the layer.

3. The method of claim 1 wherein:
   providing comprises applying a positive bias; and
   extracting comprises moving electrons from the plasma to the layer to negatively charge the layer.

4. The method of claim 1 wherein:
   providing comprises applying a negative bias; and
   extracting comprises moving positive ions from the plasma to the layer to positively charge the layer.

5. The method of claim 1 wherein:
   the plasma further comprises photons having a magnitude of energy of about 3 eV;
   providing comprises applying a negative bias; and
   extracting comprises moving positive ions from the plasma to a surface of the layer whereby the positive ions attract electrons from electron-hole pairs generated in the silicon by the photons into the layer to negatively charge the layer.

6. The method of claim 1 wherein:
   providing comprises providing the pulse at a starting time and terminating the pulse at an ending time, an amount of time between the starting time and the ending time being the duration of the pulse; and
   the duration of the pulse is in the range of 1 microsecond to 500 seconds.

7. The method of claim 1 wherein a magnitude of the pulse is between 1 and 5,000 volts.

8. A method, performed by a system, for charging a layer of a wafer, the method comprising:
   forming the layer on the wafer, the layer comprising no permanently stored charge;
   generating a plasma from an inert gas, the plasma comprising electrons and positive ions, the wafer positioned proximate to the plasma, the layer oriented toward the plasma;
   electrically biasing the wafer to establish an electric field between the wafer and the plasma;
   responsive to the electric field, extracting charged particles from the plasma to substantially permanently charge the layer.

9. The method of claim 8 wherein:
   electrically biasing comprises applying a positive voltage to the wafer; and
   extracting comprises moving electrons from the plasma into the layer to negatively charge the layer.

10. The method of claim 8 wherein:
    electrically biasing comprises applying a negative voltage to the wafer; and
    extracting comprises moving positive ions from the plasma into the layer to positively charge the layer.

11. The method of claim 8 wherein:
    the plasma further comprises photons having a magnitude of energy of about 3 eV;
    electrically biasing comprises applying a negative voltage to the wafer; and
    extracting comprises moving positive ions from the plasma to a surface of the layer whereby the positive ions attract electrons from electron-hole pairs generated in the silicon by the photons into the layer to negatively charge the layer.

12. The method of claim 8 wherein:
    electrically biasing comprises providing a pulse to the wafer, the pulse having a starting time and an ending time, an amount of time between the starting time and the ending time being the duration of the pulse; and
    the duration of the pulse is in the range of 1 microsecond to 500 seconds.

13. The method of claim 8 wherein biasing comprises providing a pulse to the wafer having a magnitude of between 1 and 5,000 volts.

14. The method of claim 8 wherein the layer comprises a dielectric layer formed of silicon nitride (SiNx).

15. The method of claim 8 wherein the layer comprises a dielectric layer formed of aluminum oxide (AlOx).

16. A method, performed by a system, for charging a layer of a wafer, the method comprising:
    forming the layer on the wafer, the layer comprising no permanently stored charge;
    generating a plasma from an inert gas, the plasma comprising electrons, positive ions, and photons, the photons having a magnitude of energy of at least about 3 eV, the wafer positioned proximate to the plasma, the layer oriented toward the plasma;
    applying a pulse to the wafer for a duration to electrically bias the wafer;
    responsive to the electrical bias, extracting at least one of electrons and positive ions from the plasma to substantially permanently charge the layer of the wafer; and
    responsive to the photons, generating electron-hole pairs in the silicon that cooperate with the at least one of electrons and positive ions to charge the layer.

17. The method of claim 16 wherein:
    applying comprises applying a negative bias; and
    extracting comprises moving positive ions from the plasma to a surface of the layer whereby the positive ions attract electrons from electron-hole pairs into the layer to negatively charge the layer.

18. The method of claim 17 wherein the layer comprises a stacked structure.

19. The method of claim 17 wherein the stacked structure comprises silicon nitride (SiNx) sandwiched between silicon oxide (SiOx).

20. The method of claim 16 wherein the duration is in the range of 1 microsecond to 500 seconds.

21. The method of claim 16 wherein biasing comprises providing a pulse to the wafer having a magnitude of between 1 and 5,000 volts.

\* \* \* \* \*